United States Patent
Park et al.

(10) Patent No.: US 12,354,842 B2
(45) Date of Patent: Jul. 8, 2025

(54) IN-SITU FOCUS RING COATING

(71) Applicant: Tokyo Electron Limited, Tokyo (JP)

(72) Inventors: Minjoon Park, Albany, NY (US); Andrew Metz, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 259 days.

(21) Appl. No.: 18/156,917

(22) Filed: Jan. 19, 2023

(65) Prior Publication Data
US 2024/0249921 A1  Jul. 25, 2024

(51) Int. Cl.
*H01L 21/311* (2006.01)
*H01J 37/32* (2006.01)

(52) U.S. Cl.
CPC .. *H01J 37/32477* (2013.01); *H01J 37/32642* (2013.01); *H01J 37/32743* (2013.01); *H01J 37/32807* (2013.01); *H01L 21/31116* (2013.01); *H01L 21/31144* (2013.01); *H01J 37/32091* (2013.01); *H01J 37/3288* (2013.01); *H01J 2237/201* (2013.01); *H01J 2237/24585* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 5,916,454 A | 6/1999 | Richardson et al. | |
| 8,622,021 B2 | 1/2014 | Taylor et al. | |
| 10,741,407 B2 | 8/2020 | Dole et al. | |
| 10,854,431 B2 | 12/2020 | Koshiishi et al. | |
| 11,008,655 B2 | 5/2021 | Canniff | |
| 2006/0043067 A1 | 3/2006 | Kadkhodayan et al. | |
| 2009/0090695 A1 | 4/2009 | Kadkhodayan et al. | |
| 2009/0151870 A1 | 6/2009 | Urakawa et al. | |
| 2009/0233450 A1* | 9/2009 | Sakao | H01L 21/3065 156/345.24 |
| 2019/0341275 A1 | 11/2019 | Jin et al. | |
| 2023/0081862 A1* | 3/2023 | Shi | H01J 37/32642 438/9 |

OTHER PUBLICATIONS

Narishige et al., "EUV Resist Curing Technique for LWR Reduction and Etch Selectivity Enhancement," Advanced Etch Technology for Nanopatterning, Proc. of SPIE vol. 8328, Mar. 16, 2012, 6 pages.

* cited by examiner

*Primary Examiner* — Roberts P Culbert
(74) *Attorney, Agent, or Firm* — Slater Matsil, LLP (57) ABSTRACT

A method of etching a substrate includes loading the substrate into a plasma etch chamber, the plasma etch chamber including a focus ring surrounding the substrate, the focus ring including a bulk material and a surface layer, the surface layer including a refractory metal; flowing a process gas including fluorine and carbon into the plasma etch chamber; coating a carbide layer over the surface layer of the focus ring, the coating including exposing the focus ring to a plasma generated from the process gas in the plasma etch chamber, the carbide layer including a carbide of the refractory metal; and etching the substrate, the etching including exposing the substrate to the plasma.

20 Claims, 9 Drawing Sheets

IN-SITU FOCUS RING COATING

CROSS-REFERENCE TO RELATED APPLICATIONS

This application is related to U.S. Non-Provisional application Ser. No. 18/156,900, filed on Jan. 19, 2023, which application is hereby incorporated herein by reference.

TECHNICAL FIELD

The present invention relates generally to methods of processing, and, in particular embodiments, to in-situ focus ring coating.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes.

Obtaining and maintaining the uniform distribution of plasma, particularly at wafer edges, may be challenging due to non-uniformity of various factors such as gas flow distribution, electrode temperature distribution, and electrical and magnetic field distribution. To mitigate this non-uniformity issue, a focus ring may be used for better uniformity of plasma distribution. However, the focus ring may be degraded and consumed over cycles of operation.

SUMMARY

In accordance with an embodiment of the present invention, a method of etching a substrate includes loading the substrate into a plasma etch chamber, the plasma etch chamber including a focus ring surrounding the substrate, the focus ring including a bulk material and a surface layer, the surface layer including a refractory metal; flowing a process gas including fluorine and carbon into the plasma etch chamber; coating a carbide layer over the surface layer of the focus ring, the coating including exposing the focus ring to a plasma generated from the process gas in the plasma etch chamber, the carbide layer including a carbide of the refractory metal; and etching the substrate, the etching including exposing the substrate to the plasma.

In accordance with an embodiment of the present invention, a method of etching a substrate includes loading the substrate into a plasma etch chamber, the substrate including a patterned hard mask layer and an underlying layer, the plasma etch chamber including a focus ring, the focus ring including a bulk material and a surface layer, the surface layer including a refractory metal; performing a surface pretreatment for the focus ring, the surface pretreatment including exposing the focus ring to a first plasma in the plasma etch chamber to form a coating over the surface layer; and performing a plasma etch process to etch the underlying layer, the plasma etch process including exposing the substrate to a second plasma in the plasma etch chamber, where the coating protects the focus ring from being etched by the second plasma In accordance with an embodiment of the present invention, a method of etching a substrate includes repeatedly performing a plasma etch process for a plurality of substrates in a plasma etch chamber including a focus ring, the focus ring including a bulk material and a surface layer, the surface layer including a refractory metal, the focus ring having a thickness at an outer edge greater than a thickness at an inner edge, each of the plurality of the substrates including a patterned hard mask layer and an underlying layer, the plasma etch process including loading one of the plurality of substrate into the plasma etch chamber, and exposing the substrate to a plasma generated from a process gas including fluorine and carbon in the plasma etch chamber, the plasma etching the underlying layer, where a coating including a carbide of the refractory metal is formed over the surface layer of the focus ring; and evaluating a wear damage of the focus ring, the evaluating including determining a change in a thickness of the focus ring at the outer edge or the inner edge.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A and 2B illustrate cross sectional views of a metal-containing focus ring in a plasma processing chamber in accordance with various embodiments, wherein

FIGS. 3A and 3B illustrate cross sectional views of a focus ring without metal in a plasma processing chamber in accordance with various embodiments, wherein

FIGS. 5A and 5B illustrate cross sectional views of an example substrate during an example high aspect ratio (HAR) patterning process performed using a plasma processing system in accordance with various embodiments, wherein FIGS. 6A-6C illustrate process flow diagrams of the methods of in-situ coating of a focus ring in accordance with various embodiments, wherein FIG. 6A illustrates an embodiment.

DETAILED DESCRIPTION OF ILLUSTRATIVE EMBODIMENTS

This application relates to methods of processing a substrate during semiconductor device fabrication, more particularly to in-situ focus ring coating in a plasma processing chamber to extend the lifetime of focus ring. In a typical plasma processing system configured to process a substrate, a focus ring may be used to maintain and extend the uniformity of plasma to achieve process consistency at the edge of the substrate. However, the focus ring may be degraded and consumed over a prolonged usage from repeated plasma processes, leading to the loss of plasma uniformity at the edge and thereby reduced die yield. To replace a worn, used focus ring with a new one, time-consuming open chamber service with equipment downtime is generally necessary. Therefore, a method of maintaining the quality of the focus ring without significant equipment downtime may be desired. Embodiments of the present application disclose methods of in-situ focus ring coating, for example, using metal carbide that offers improved wear resistance and durability.

The method described in this disclosure may extend the lifetime of focus ring without opening the chamber, thereby advantageously reducing the frequency of open chamber service required for replacing a consumed focus ring. In various embodiments, the mean time between wet cleaning (MTBWC) may be extended. A focus ring comprising a metal (e.g., W) may be used, and the metal-containing coating may be formed in-situ under the presence of plasma. For example, the methods may be applied in a high-aspect ratio contact (HARC) etch or high-aspect ratio trench (HART) etch using fluorocarbon gases, where the metal of the focus ring may react with the carbon from the process gas and forms a highly stable protective coating made of metal carbide on the surface of the focus ring. Accordingly, with the improved lifetime of focus ring, the method in this disclosure may improve the die yield especially at the edge of substrate and the efficiency of plasma processing for semiconductor device fabrication.

In the following, an example capacitively coupled plasma (CCP) etching system with a metal-containing focus ring is first described referring to FIG. 1. The wear resistance of the metal-containing focus ring is then described referring to FIGS. 2A-2D, 3A-3B, and 4. An example HARC/HART etch with uniformity owing to the metal-containing focus ring is described referring to FIGS. 5A-5B. Example process flow diagrams of in-situ focus ring coating are illustrated in FIG. 6A-6C. All figures in this disclosure are drawn for illustration purpose only and not to scale, including the aspect ratios of features.

Figure 1:
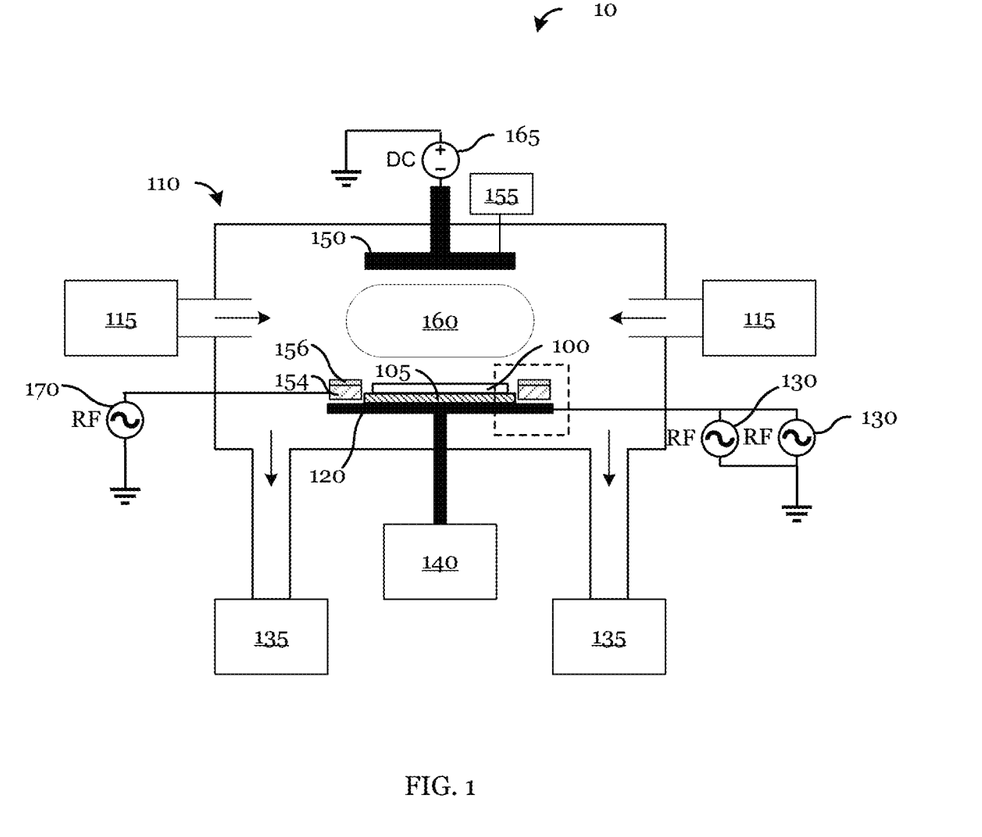
FIG. 1 illustrates an example capacitively coupled plasma (CCP) processing system having a top electrode with a metal coating in accordance with various embodiments.

FIG. 1 illustrates an example capacitively coupled plasma (CCP) processing system 10 in accordance with various embodiments.

As illustrated in FIG. 1, the CCP processing system 10 comprises a plasma processing chamber 110, and a substrate 100 may be placed on a substrate holder 105. In various embodiments, the substrate 100 may be a part of, or including, a semiconductor device, and may have undergone a number of steps of processing following, for example, a conventional process. The substrate 100 accordingly may comprise layers of semiconductors useful in various microelectronics. For example, the semiconductor structure may comprise the substrate 100 in which various device regions are formed.

In one or more embodiments, the substrate 100 may be a silicon wafer, or a silicon-on-insulator (SOI) wafer. In certain embodiments, the substrate 100 may comprise a silicon germanium wafer, silicon carbide wafer, gallium arsenide wafer, gallium nitride wafer and other compound semiconductors. In other embodiments, the substrate 100 comprises heterogeneous layers such as silicon germanium on silicon, gallium nitride on silicon, silicon carbon on silicon, as well layers of silicon on a silicon or SOI substrate. In various embodiments, the substrate 100 is patterned or embedded in other components of the semiconductor device.

One or more process gases may be introduced into the plasma processing chamber 110 by a gas delivery system 115. The gas delivery system 115 may comprise multiple gas flow controllers to control the flow of multiple gases into the plasma processing chamber 110. In some embodiments, optional center/edge splitters may be used to independently adjust the gas flow rates at the center and edge of the substrate 100. Further, in one embodiment, the gas delivery system 115 may have a special showerhead configuration positioned at the top of the plasma processing chamber 110. For example, the gas delivery system 115 may be integrated with a top electrode 150, having a showerhead configuration on the top electrode 150, covering the entirety of the substrate 100, including a plurality of appropriately spaced gas inlets. Alternatively, gas may be introduced through dedicated gas inlets of any other suitable configuration. The plasma processing chamber 110 may further be equipped with one or more sensors such as pressure monitors, gas flow monitors, and/or gas species density monitors. The sensors may be integrated as a part of the gas delivery system 115 in various embodiments.

In FIG. 1, the plasma processing chamber 110 is a vacuum chamber and may be evacuated using one or more vacuum pumps 135, such as a single stage pumping system or a multistage pumping system (e.g. a mechanical roughing pump combined with one or more turbomolecular pumps). In order to promote even gas flow during plasma processing, gas may be removed from more than one gas outlet or location in the plasma processing chamber 110 (e.g., on opposite sides of the substrate 100).

In various embodiments, the substrate holder 105 may be integrated with, or a part of, a chuck (e.g., a circular electrostatic chuck (ESC)) positioned near the bottom of the plasma processing chamber 110, and connected to a bottom electrode 120. The surface of the chuck or the substrate holder 105 may be coated with a conductive material (e.g., a carbon-based or metal-nitride based coating). The substrate 100 may be optionally maintained at a desired temperature using a temperature sensor and a heating element connected to a first temperature controller 140. In certain embodiments, the temperature sensor may comprise a thermocouple, a resistance temperature detector (RTD), a thermistor, or a semiconductor based integrated circuit. The heating element may for example comprise a resistive heater in one embodiment. In addition, there may be a cooling element such as a liquid cooling system coupled to the first temperature controller 140. The bottom electrode 120 may be connected to one or more RF power sources 130 to generate a plasma 160 in the plasma processing chamber 110. As illustrated in FIG. 1, more than one RF power sources may be used, for example, to provide a high frequency RF power (HF) and a low frequency RF power (LF) at the same time. In various embodiments, the HF may be used for plasma and radical generation the LF may be used for ion acceleration in a sheath of the plasma 160 over the substrate 100 that enables plasma etching on the substrate 100. In certain embodiments for a CCP processing system, the frequency of the HF may range from 27 MHz to 150 MHz, and that of the LF may range from 400 kHz to 13 MHz. The RF power sources 130 may be used to supply continuous wave (CW) or pulsed RF power to sustain the plasma 160. The plasma 160, shown between a top electrode 150 and the bottom electrode 120, exemplifies direct plasma generated close to the substrate 100 in the plasma processing chamber 110.

In various embodiments, a RF pulsing at a kHz range may be used to power the plasma 160. Using the RF pulsing may help generating high energetic ions (>keV) in the plasma 160 for the plasma etch process, while reducing a charging effect. The charging effect during a process is a phenomenon where electrons build charge on insulating materials creating a local electric field that may steer positive ions to the sidewalls and cause a lateral etching. Therefore, fine tuning the power conditions of the plasma etch process may also be important to minimize the widening of critical dimension (CD) of the high aspect ratio (HAR) feature. In certain embodiments, a moderate duty ratio between 10% and 100% may be used. In one embodiment, a bias power of 18 kW may be pulsed at a frequency of 5 kHz with a duty ratio of 60%.

Further illustrated in FIG. 1, the top electrode 150 may be a conductive circular plate inside the plasma processing chamber 110 near the top. In various embodiments, the top electrode 150 may be connected to a to direct current (DC) voltage source 165 of the CCP processing system 10. Combined with the RF power from the RF power sources 130, the DC voltage is used to generate a DC superimposed RF plasma in the plasma processing chamber 110. In FIG. 1, the DC voltage may be supplied to the top electrode 150. In another embodiment, the DC voltage may be supplied to the bottom electrode 120. In various embodiments, the DC voltage may advantageously be adjusted to tune the degree of metal sputtering and thereby the concentration of the metal elements in the plasma 160.

The DC voltage supplied by the DC voltage source 165 can range from positive to negative. A negative DC voltage at the top electrode 150 may advantageously adjust (e.g., increase) the average ion energy of species of the plasma 160. In various embodiments, the DC voltage $V_{DC}$ coupled to the top electrode 150 may be in the range of 0 V to about 3000 V. In one embodiment, the DC voltage $V_{DC}$ coupled to the top electrode 150 may be about −200 V. In further embodiments, instead of the DC voltage source 165, another RF power source may be used and configured to provide a RF power to the top electrode 150. In one or more embodiments, the frequency for the RF power to the top electrode 150 may range from 400 kHz to 13 MHz.

The top electrode 150 may in one or more embodiments, be connected to a second temperature controller 155 configured to control the temperature of the top electrode 150. The second temperature controller 155 may further comprise or be coupled to a temperature sensor and a heating element. In certain embodiments, the temperature sensor may comprise a thermocouple, a resistance temperature detector (RTD), a thermistor, or a semiconductor based integrated circuit. The heating element may for example comprise a resistive heater in one embodiment. In addition, there may be a cooling element such as a liquid cooling system coupled to the second temperature controller 155.

In various embodiments, the CCP processing system 10 may further comprise a focus ring 154 positioned over the bottom electrode 120. Generally, the focus ring has a ring shape configured to surround the substrate 100. The focus ring 154 may advantageously maintain and extend the uniformity of the plasma 160 to achieve process consistency at the edge of the substrate 100. In various embodiments, the focus ring 154 may have a width of a few cm. In various embodiments, there may be a gap for mechanical clearance between the circumference of the substrate 100 and the focus ring 154. In certain embodiments, the gap may be hundreds of microns to a few mm. In various embodiments, the focus ring 154 may comprise a dielectric material with a desired dielectric constant. In certain embodiments, the focus ring 154 may comprise silicon. Some examples of silicon-based focus ring may comprise silicon, silicon oxide, doped silicon (e.g., boron-doped, nitrogen-doped, and phosphorous-doped), or silicon carbide. Alternatively, in some embodiments, the focus ring may comprise a carbon-based material. In one or more embodiments, the focus ring 154 may be coupled to bias power via the bottom electrode 120 or a separate RF power source. An additional temperature controller may also be present configured to separately control the temperature of the focus ring 154.

In various embodiments, the focus ring 154 is particularly characterized by comprising a metal, for example, in form of a metal-containing coating 156 as illustrated in FIG. 1. Although the metal-containing coating 156 covers the top surface of the focus ring 154 in FIG. 1, in alternate embodiments, the metal may be incorporated in the focus ring 154 in any reasonable fashion as long as the metal may be available for in-situ coating. Accordingly, the metal may be incorporated by, for example, the focus ring 154 entirely made of, plated with, brazed with, or deposited with the metal, metal carbide, metal nitride, metal silicide, or other metal compounds.

In certain embodiments, the metal may be a refractory metal such as tungsten (W). Examples of the metals useful for the metal-containing coating 156 further include titanium (Ti) and tantalum (Ta), but other metals may also be used. The metal-containing coating 156 may be in pure metal form in certain embodiments, but in other embodiments, it may be metal carbide (e.g., WC), metal nitride (e.g., WN), metal silicide ($WSi_x$), or other metal compounds. Further, the metal-containing coating 156 may also comprise a thin layer of an oxide on surface.

As illustrated in FIG. 1, the focus ring 154 may be connected to a RF power source 170 configured to apply a RF bias to the focus ring 154 in one embodiment. In another embodiment, a DC voltage source may be used instead of a RF power source. Applying a bias to the focus ring 154 may advantageously improve the uniformity of the plasma 160 in the plasma processing chamber 110. The first temperature controller 140 may also be configured to control the temperature of the focus ring 154 in certain embodiments. Controlling the temperature of the metal-containing coating 156 may be useful in adjusting the degree of in-situ coating.

Although not illustrated in FIG. 1, a metal may be incorporated into other chamber parts (e.g., the top electrode 150 and a chamber wall), and in certain embodiments, metal sputtering from the metal-containing chamber parts and redeposition of the metal from the plasma onto the substrate 100 may advantageously provide additional benefits such as improved etch selectivity.

The configurations of the CCP processing system 10 described above and in FIG. 1 is for example only. In alternative embodiments, various alternative configurations, including an inductively coupled plasma (ICP) processing system, may be used. In an embodiment for an ICP processing system, a conductive helical coil electrode may be used and located above a top plate 212 or besides the sidewalls of the chamber. In another example, the plasma processing system may be a resonator such as a helical resonator. Further, microwave plasma (MW) or other suitable systems may be used. Pulsed RF power sources and pulsed DC voltage sources may also be used in some embodiments (as opposed to continuous wave RF power sources). In various embodiments, the RF power, chamber pressure, substrate temperature, gas flow rates and other plasma process parameters may be selected in accordance with the respective process recipe. In various embodiments, a plasma etching process such as reactive ion etching (RIE) may comprise controlling the plasma condition to enable/disable the in-situ focus ring coating.

Figure 2A:
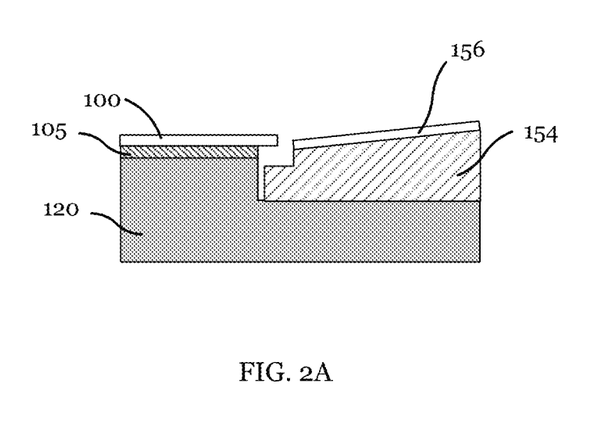
FIG. 2A illustrates the metal-containing focus ring before in-situ coating.
Figure 2B:
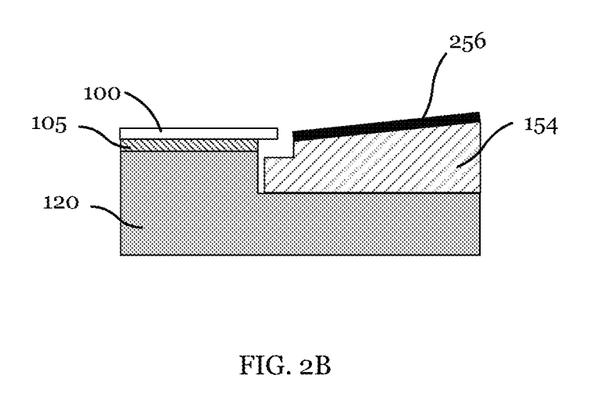
FIG. 2B illustrates the metal-containing focus ring after the in-situ coating.
Figure 2C:
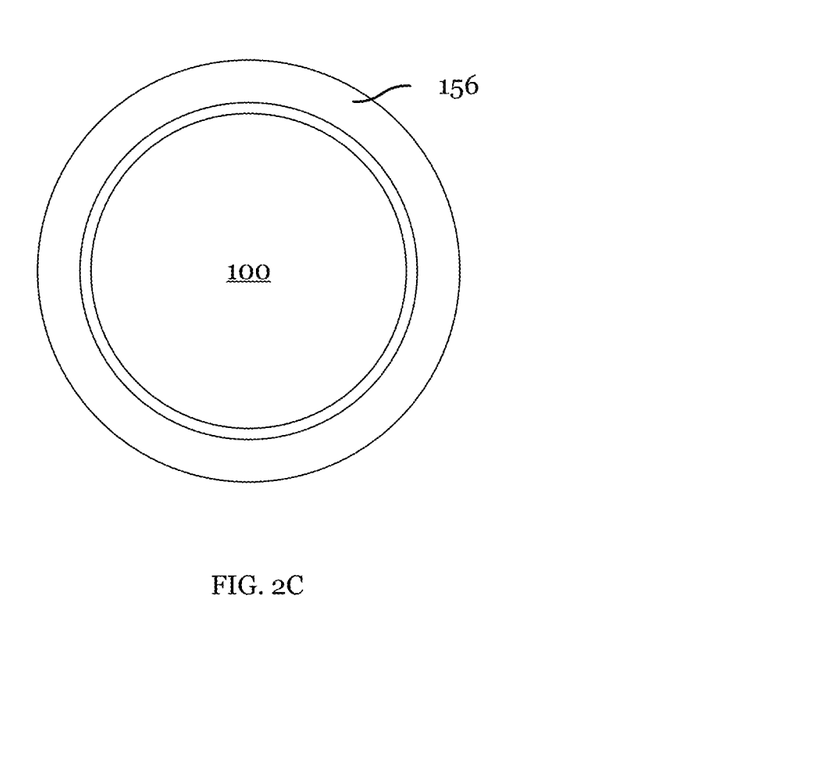
FIG. 2C illustrates a top view of a substrate surrounded by a focus ring having a metal-containing coating in accordance with various embodiments.
Figure 2D:
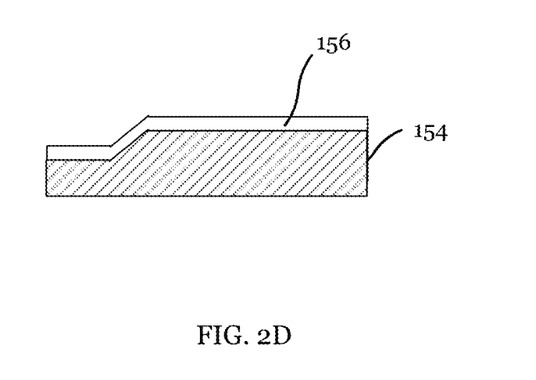
FIG. 2D illustrates a cross sectional view of a metal-containing focus ring in accordance with another embodiment.

FIGS. 2A and 2B illustrate cross sectional views of a focus ring 154 in accordance with various embodiments. FIGS. 2A and 2B are a right half of the cross section and illustrates an area from the center of a substrate to an edge of the focus ring. FIG. 2C illustrates a top view of the substrate 100 surrounded by a focus ring with a metal-containing coating 156. FIG. 2D illustrates a cross sectional view of a metal-containing focus ring in accordance with another embodiment;

In FIG. 2A, a substrate 100 positioned on a substrate holder 105, a bottom electrode 120, a focus ring 154, and a metal-containing coating 156 are illustrated. The cross sectional views of FIGS. 2A and 2B only illustrate about a half of each item, corresponding to a dotted square in FIG. 1 for illustration purpose. Details of each item in FIG. 2A may be the same as those in FIG. 1, and will not be repeated. In one or more embodiments, the focus ring 154 may comprise silicon and the metal-containing coating 156 may comprise a refractory metal (e.g., W). This structural design of the main body (i.e., Si) with the surface coating comprising a metal may be advantageous in view of manufacturing cost of a focus ring. Manufacturing the entirety of a focus ring out of a highly etch resistant material such as carbide (e.g., SiC and metal carbide) may tend to be costly. Since the wear damage of the focus ring primarily occurs on its surface, incorporating the metal only to the surface of the focus ring can improve the wear resistance while minimizing the manufacturing cost. In certain embodiments, the main body of the focus ring 154 may account for at least 90% by mass of the total mass of the focus ring 154 and the metal-containing coating 156. In one embodiment, the focus ring 154 may account between 90% and 99% by mass of the total mass.

As illustrated in FIG. 2C, the metal-containing coating 156 may cover the entire surface of the focus ring 154 that has a ring shape. Although the metal-containing coating 156 in FIG. 2A is illustrated as a distinct layer and there is a clear interface between the main body of the focus ring 154 and the metal-containing coating 156, in certain embodiments, the composition from the surface to the bulk may have a gradient without a clear interface.

Referring back to FIG. 2A, the focus ring 154 may have an inward slope to maintain the plasma density at the edge region of the substrate 100. In other words, the focus ring 154 may have a thickness at an outer edge greater than a thickness at an inner edge. In various embodiments, as illustrated in FIG. 2D, the inward slope may be present only on a part of the focus ring 154, and there may be two flat surfaces at the out and inner edges, with the outer edge being thicker. A focus ring may be in any reasonable shape for the purpose of plasma uniformity and is not limited to those illustrated in FIGS. 2A-2D.

Further, in one or more embodiments, the bottom surface of focus ring 154 may be made of or coated with another material different from the bulk material, for example, a doped silicon, such that applying bias power to the focus ring 154 may be enabled. The focus ring 154 may be coupled to bias power via the bottom electrode 120 to ensure the continuity of plasma at the edge and periphery of the substrate 100. In certain embodiments, the focus ring 154 may further be connected to a separate RF power source or a temperature controller, which allows local adjustment of condition for the focus ring 154 independently.

In FIG. 2B, the focus ring 154 may be in-situ coated. In various embodiments, the metal-containing coating 156 may be converted to a metal carbide coating 256. This coating may be formed in the plasma processing chamber configured to perform, for example, a plasma etch process for the substrate 100 and during such a plasma etch process, thereby referred to as "in-situ." In certain embodiments, during the in-situ coating in the plasma etch process, a polymeric layer may first be deposited on the metal-containing coating 156, followed by a reaction between the metal element and the polymeric layer to form metal carbide. Although the metal carbide coating 256 in FIG. 2B is illustrated as a distinct layer and there is a clear interface between the main body of the focus ring 154 and the metal carbide coating 256, in certain embodiments, the composition from the surface to the bulk may have a gradient without a clear interface. Further, in one or more embodiments, the incorporation of carbon into the metal-containing coating 156 may be at a low concentration level and may be regarded as doping rather than metal carbide formation. In one embodiment, the doping concentration of carbon may be between $10^{13}$ atoms/cm$^3$ and $10^{18}$ atoms/cm$^3$.

In certain embodiments, in-situ focus ring coating may be achieved during a fabricating a high aspect ratio (HAR) feature by a plasma etch process. The plasma etch process may use a process gas comprising any reasonable gas that may provide an etchant for the plasma etch process, for example a halogen. The process gas may also include carbon that may be incorporated in the metal carbide coating 256. Accordingly, in one or more embodiments, the process gas may comprise fluorocarbon or hydrofluorocarbon. Examples of such process gases include tetrafluoromethane ($CF_4$), trifluoromethane ($CHF_3$), difluoromethane ($CH_2F_2$), octafluoropropane ($C_3F_8$), hexafluoropropylene ($C_3F_6$), perfluorobutane ($C_4F_{10}$), octafluorocyclobutane ($C_4F_8$), octafluoro-2-butene ($C_4F_8$), perflenapent ($C_5F_{12}$), hexafluorobutadiene ($C_4F_6$), hexafluoro-2-butyne ($C_4F_6$), and hexafluorocyclobutene ($C_4F_6$). In certain embodiments, other gases such as a noble gas and/or a balancing agent may also be added. For example, in certain embodiments, helium (He), argon (Ar), krypton (Kr) and xenon (Xe) and dioxygen ($O_2$) may be included as the noble gas and the balancing agent, respectively.

Figure 3A:
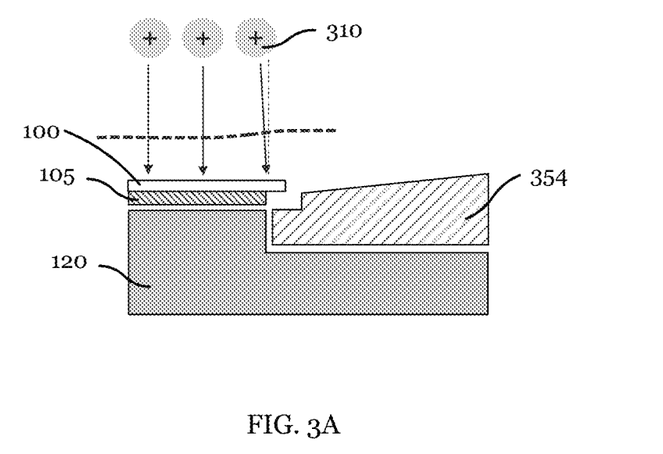
FIG. 3A illustrates the focus ring before any plasma processing.
Figure 3B:
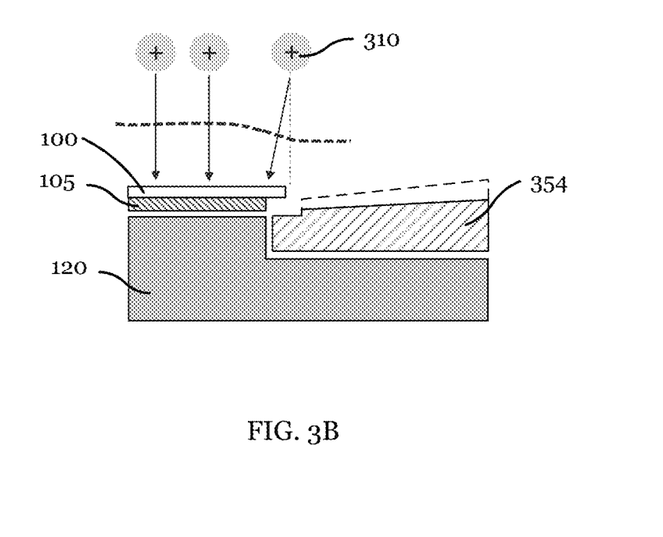
FIG. 3B illustrates the focus ring with wear damage after the plasma processing.

FIGS. 3A and 3B illustrate cross sectional views of a focus ring 354 without metal in accordance with various embodiments.

In FIGS. 3A and 3B, a substrate 100 positioned on a substrate holder 105, a bottom electrode 120, and a metal-free focus ring 354 that is conventionally used, are illustrated. Details of each item in FIG. 3A may be the same as those in FIGS. 1 and 2A except the absence of a metal-containing coating, and will not be repeated. In contrast to a metal-containing focus ring, the metal-free focus ring 354, illustrated in FIGS. 3A-3B, may be more prone to wear damage by plasma. Initially, the metal-free focus ring 354 adequately maintains the uniformity of plasma across the substrate 100, and ions 310 at the edge may be directed to the substrate 100 with a negligible angle deviation from the other regions (e.g., the central area) as indicated by arrows in FIG. 3A. However, after hours of plasma exposure (e.g., ~200 h for HARC applications), the metal-free focus ring 354 may be worn, as illustrate in FIG. 3B, and the uniformity of plasma may be deteriorated. The reduced thickness and loss of the initial slope of focus ring may locally bend the plasma sheath at the edge of the substrate 100. The ions 310 at the edge may therefore be deflected and the angle deviation at the edge (θ) may worsen with time. Consequently, with the worn focus ring, the plasma etch process may suffer from poor etch uniformity across the substrate 100, for example, a slower etch rate at the edge and contact tilting at the edge. The worn focus ring (e.g., the metal-free focus ring 354 in FIG. 3B) has to be replaced with a new one by open chamber service that requires a substantial equipment downtime.

Figure 4:
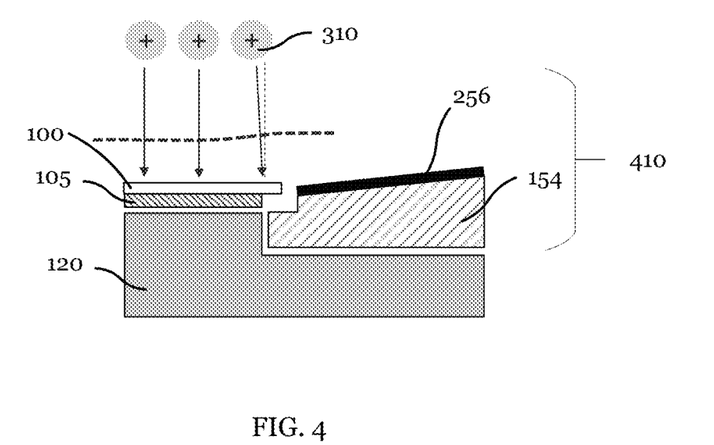
FIG. 4 illustrates a cross sectional view of an in-situ coated metal-containing focus ring in a plasma processing chamber after plasma processing in accordance with various embodiments.

FIG. 4 illustrates a cross sectional view of an in-situ coated metal-containing focus ring 410 after plasma processing in accordance with various embodiments. Details of illustrated items may be the same as those in FIG. 2A and will not be repeated.

The wear damage to focus ring due to hours of plasma exposure may advantageously be minimized or eliminated by using the in-situ coated metal-containing focus ring 410 as illustrated in FIG. 4. In various embodiment, the in-situ coated metal-containing focus ring 410 may be prepared during plasma processing as described above referring to FIGS. 2A-2B. The in-situ coated metal-containing focus ring 410 may maintain the initial slope of focus ring even after prolonged equipment usage with plasma exposure (e.g., >200 h exposure time for HARC applications). Accordingly, the straight contact at the edge and the uniformity of plasma across the substrate 100 may be maintained and provide uniform etch performance (e.g., straight contacts and uniform etch rate across the substrate 100). With the in-situ coated metal-containing focus ring 410, the frequency of open chamber service may be reduced, and in various embodiments, the mean time between wet cleaning (MTBWC) may be extended, for example, by 30% compared with a conventional focus ring without metal carbide coating. In another embodiment, the life of a focus ring may be prolonged by the metal carbide coating by a factor of at least 2.

In certain embodiments, the in-situ coated metal-containing focus ring 410 may eventually experience wear damage with extended equipment usage with plasma exposure (e.g., >1000 h exposure time for HARC applications), which may start causing the non-uniformity issue. Instead of replacing the used focus ring with a new one, the methods of in-situ focus ring coating may be extended to regenerate the metal carbide coating 256. Advantageously, this regeneration may be achieved in the plasma processing chamber without opening the chamber to atmosphere. In one embodiment, a metal-containing precursor (e.g., $WF_6$) may be introduced to the plasma processing for chemical vapor deposition of metal species over the surface of the used focus ring. Subsequently, the metal-containing surface of the focus ring may be exposed to a plasma comprising carbon, as described above referring to FIGS. 2A-2B, to form a new layer of metal carbide.

Further, for determining the optimal timing for regenerating the surface coating of focus ring, the methods of in-situ focus ring coating may also comprise steps of evaluating the wear damage. While the surface coating (e.g., the metal carbide coating 256) may be regenerated as described above, it may not be possible to restore the bulk material (e.g., Si) of the focus ring 154 once it is damaged and the focus ring itself may have to be replaced with open chamber service. Moreover, since the bulk material is expected to be more prone to wear damage, the rage of wear may become substantially higher once the surface coating is completely removed. Therefore, it is important to evaluate the degree of wear damage with equipment usage and perform focus ring maintenance before the surface coating is completely lost and the bulk material is exposed on surface. In one embodiment, evaluating the wear damage of the focus ring may be performed by determining a change in a thickness of the focus ring, an angle of the inward slope of the focus ring or a weight of the focus ring. In another embodiment, elements etched from the surface of the focus ring may be characterized, for example, using an optical emission spectroscopy (OES).

As described above, the wear damage may lead to loss of plasma uniformity especially at the edge, the angle deviation at the edge (θ) for the ions during a plasma etch process must be kept under a threshold. Generally, the acceptable limit for the angle deviation at the edge may depend on types of the plasma etch process and features to be fabricated by the plasma etch process. In one embodiment, the acceptable limit may be about 0.1°, but in another embodiment, about 0.01°. When the plasma etch process is for high aspect ratio (HAR) patterning, as described below referring to FIGS. 5A and 5B, the acceptable limit for the angle deviation may depend on the AR of the feature to be formed. For example, the higher the AR is, the stricter the acceptable limit for the angle deviation may be.

Figure 5A:
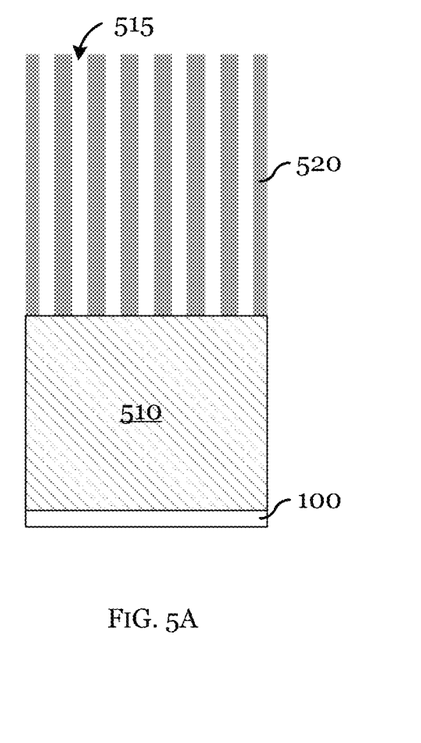
FIG. 5A illustrates an incoming substrate with a patterned hard mask and a material layer.
Figure 5B:
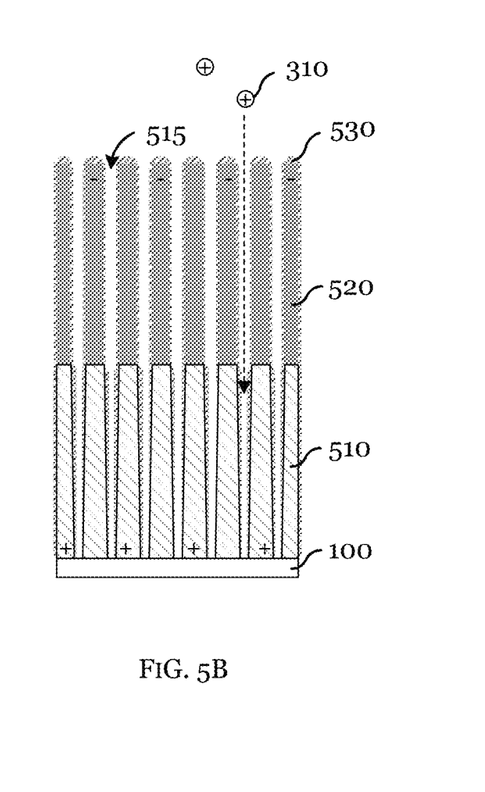
FIG. 5B illustrates the substrate after reactive ion etching (RIE)
Figure 6A:
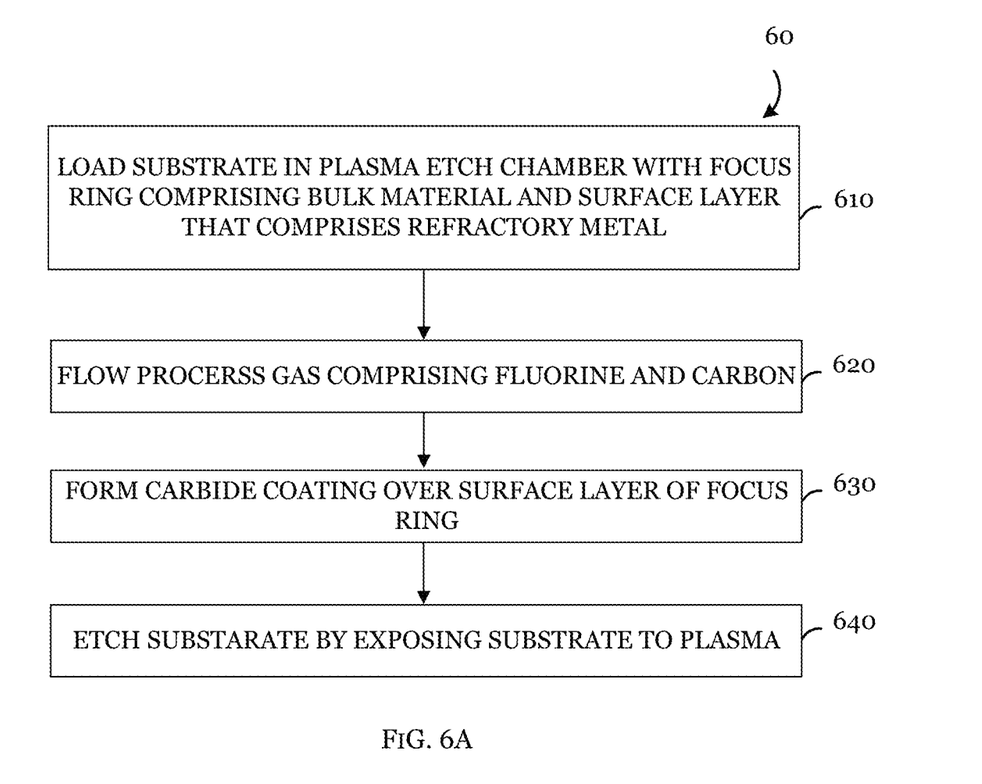
Figure 6B:
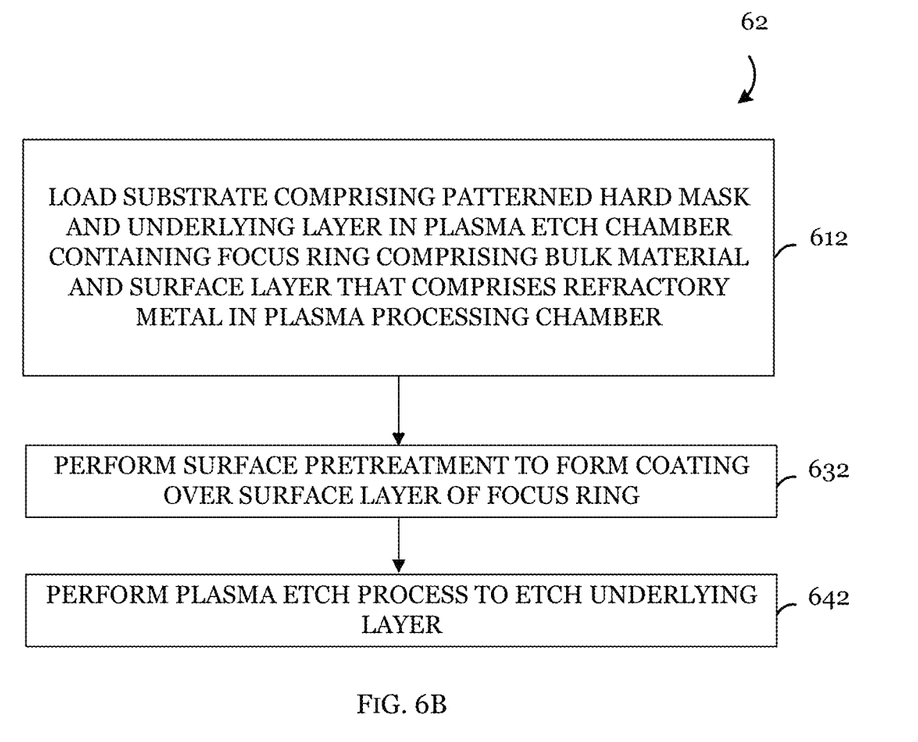
FIG. 6B illustrates another embodiment.
Figure 6C:
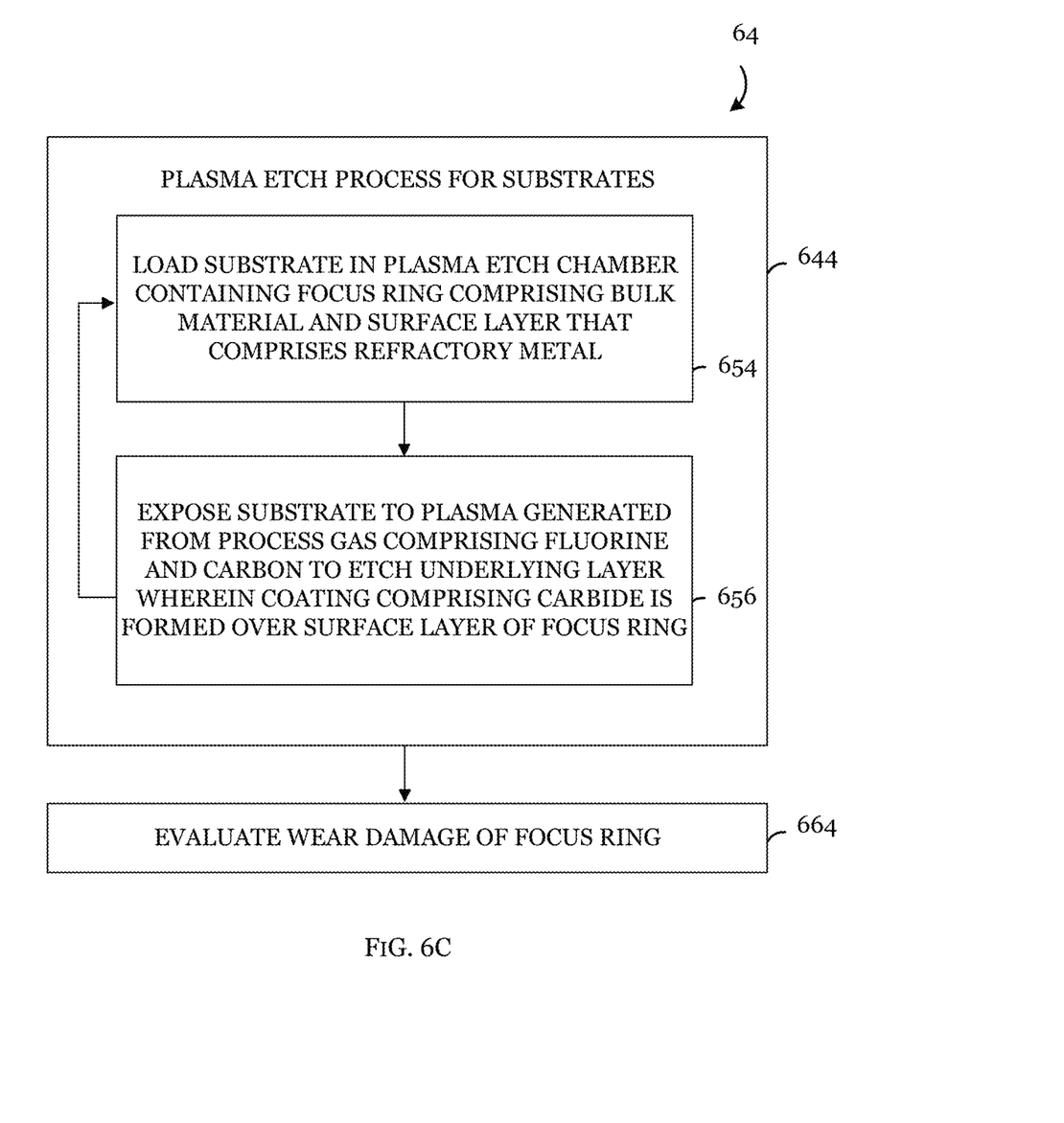
FIG. 6C illustrates yet another embodiment.

FIGS. 5A and 5B illustrate cross sectional views of an example substrate 100 during an example high aspect ratio (HAR) patterning process using a plasma processing system in accordance with various embodiments.

FIG. 5A illustrates a cross sectional view of an incoming substrate 100 with a patterned layer 520 and a material layer 510. In FIG. 5A, a material layer 510 may be formed over the substrate 100. In various embodiments, the material layer 510 may be a target layer that is to be patterned into one or more high aspect ratio (HAR) features. In certain embodiments, the HAR feature being etched into the material layer 510 may be a contact hole, slit, or other suitable structures comprising a recess that may be useful in high capacity three-dimensional (3D) memory devices, such as a 3D-NAND (or vertical-NAND), 3D-NOR, or dynamic random access memory (DRAM) device. These devices typically require forming conformal, high aspect ratio contact holes (HARC) or trenches (HART). In certain embodiments, the material layer 510 is a layer stack comprising multiple layers, for example, alternating oxide layers and nitride layers.

In one embodiment, the material layer 510 may be a silicon oxide layer. The material layer 510 may be deposited using an appropriate technique such as vapor deposition including chemical vapor deposition (CVD), physical vapor deposition (PVD), atomic layer deposition (ALD), as well as other plasma processes such as plasma enhanced CVD (PECVD) and other processes. In one embodiment, the material layer 510 has a thickness between 0.1 μm and 100 μm.

Still referring to FIG. 5A, a patterned layer 520 having recesses 515 is formed over the material layer 510. In various embodiments, the patterned layer 520 may comprise any material useful to enable patterning of the material layer 510 by subsequent patterning processes.

In various embodiments, the patterned layer 520 may comprise a photoresist, an organic dielectric layer (ODL), or amorphous carbon layer (ACL). The patterned layer 520 may comprise a hard mask, including but not limited to, amorphous silicon, silicon nitride, or a metal-based hard mask. In one or more embodiments, the patterned layer 520 may be a layer stack comprising multiple layers, for example, a tri-layer stack commonly used for a photolithographic process.

The patterned layer 520 may be formed by first depositing a hard mask layer using, for example, an appropriate spin-coating technique or a vapor deposition technique such as chemical vapor deposition (CVD), physical vapor deposition (PVD), atomic layer deposition (ALD), as well as other plasma processes such as plasma enhanced CVD (PECVD) and other processes. The deposited hard mask layer may then be patterned using a lithography process and an anisotropic etch process. The relative thicknesses of the patterned layer 520 and the material layer 510 may have any suitable relationship. For example, the patterned layer 520 may be thicker than the material layer 510, thinner than the material layer 510, or the same thickness as the material layer 510. In one embodiment, the patterned layer 520 has a thickness between 0.1 μm and 10 μm.

The patterned layer 520 and/or the material layer 510 may be collectively considered as a part of the substrate 100. Further, the substrate 100 may also comprise other layers. For example, for the purpose of patterning the layer, a tri-layer structure comprising a photoresist layer, SiON layer, and optical planarization layer (OPL) may be present.

FIG. 5B illustrates a cross sectional view of the substrate 100 after reactive ion etching (RIE) with plasma uniformity.

The plasmas etch process may be a single step process or a multi-step process including a cyclic process, and may be a fluorocarbon or hydrofluorocarbon-based process. In FIG. 5B, the HAR feature is being formed by extending the recesses 515 into the material layer 510 by the plasma etch process. Using a focus ring (e.g., the in-situ coated metal-containing focus ring 410 in FIG. 4), the uniformity of plasma across the substrate 100 may be well maintained, allowing the uniform etch rate and CD control including the edge region of the substrate 100 as illustrated in FIG. 5B. In certain embodiments, the sidewalls of the patterned layer 520 and the material layer 510 may be protected during the plasma etch process by a passivation layer 330. As a result, the recesses 515 may be extended straight without substantial lateral etching.

Once the plasma etch process to form the HAR feature is completed, appropriate subsequent fabrication steps may be followed accordingly to, for example, a conventional process recipe. Such steps may be including, but not limited to, a removal of the remaining hard mask, a metallization, a staircase etch to form a staircase structure in the material layer 510 in case of fabricating a 3D NAND device.

In various embodiments, the in-situ coating of focus ring (e.g., FIGS. 2A-2B) may be realized simultaneously with the plasma etch process (e.g., FIGS. 5A-5B) to form HAR features. The plasma formed in a plasma etch chamber for the plasma etch process can trigger and induce the formation of metal carbide on surface of the focus ring. In other embodiments, the process parameters (e.g., source power, bias power, process gas composition, and temperature) may be adjusted respectively for the in-situ coating and the etch process.

FIGS. 6A-6C illustrate a process flow diagrams of in-situ focus ring coating process in accordance with various embodiments. These process flows can be followed with the figures discussed above (e.g., FIGS. 2A-2B) and hence will not be described again.

In FIG. 6A, a process flow 60 starts with loading a substrate into a plasma etch chamber that contains a focus ring comprising a bulk material and a surface layer comprising a refractory metal (block 610, FIG. 2A). Next, a process gas comprising fluorine and carbon is flowed into the plasma etch chamber (block 620). A plasma generated from the process gas is then sustained in the plasma etch chamber, followed by forming the carbide coating over the surface layer by exposing the focus ring to the plasma (block 630, FIG. 2B). The substrate may then be etched by exposing the substrate to the plasma, where the plasma uniformity can be maintained for an extended period of time owing to the carbide-coated focus ring (block 640).

In FIG. 6B, a process flow 62 starts with loading a substrate into a plasma etch chamber, where the substrate comprises a patterned hard mask layer and an underlying layer and the plasma etch chamber contains a focus ring comprising a bulk material and a surface layer that comprises a refractory metal (block 612, FIG. 2A). Subsequently, a surface pretreatment may be performed for the focus ring to form a coating over the surface layer by exposing the focus ring to a first plasma in the plasma etch chamber (block 632, FIG. 2B). A plasma etch process may then be performed to etch the underlying layer by exposing the substrate to a second plasma in the plasma etch chamber, where the coating prevents the focus ring from being etched by the second plasma(block 642).

In FIG. 6C, a process flow 64 starts with repeatedly performing a plasma etch process for a plurality of substrates in a plasma etch chamber (block 644), where each substrate comprises a patterned hard mask layer and an underlying layer and the plasma etch chamber contains a focus ring comprising a bulk material and a surface layer that comprises a refractory meta. The plasma etch process comprises loading one of the plurality of substrate into the plasma etch chamber (block 654), and exposing the substrate to a plasma generated from a process gas comprising fluorine and carbon in the plasma etch chamber to etch the underlying layer (block 656), where a coating comprising a carbide of the refractory metal is formed over the surface layer of the focus ring. After cycles of the plasma etch process, a wear damage of the focus ring is evaluated by, for example, determining a change in an angle of the inward slope of the focus ring (block 664).

Example embodiments of the invention are summarized here. Other embodiments can also be understood from the entirety of the specification as well as the claims filed herein.

Example 1. A method of etching a substrate includes loading the substrate into a plasma etch chamber, the plasma etch chamber including a focus ring surrounding the substrate, the focus ring including a bulk material and a surface layer, the surface layer including a refractory metal; flowing a process gas including fluorine and carbon into the plasma etch chamber; coating a carbide layer over the surface layer of the focus ring, the coating including exposing the focus ring to a plasma generated from the process gas in the plasma etch chamber, the carbide layer including a carbide of the refractory metal; and etching the substrate, the etching including exposing the substrate to the plasma.

Example 2. The method of example 1, where the substrate includes a patterned hard mask layer and an underlying layer, and where the etching includes etching the underlying layer.

Example 3. The method of one of examples 1 or 2, further including performing cycles of plasma etch process for a plurality of substrates without chamber open service to replace the focus ring, a total time duration of the cycles of plasma etch process is between 20 h and 1000 h.

Example 4. The method of one of examples 1 to 3, where the patterned hard mask layer includes amorphous carbon layer (ACL).

Example 5. The method of one of examples 1 to 4, where the underlying layer includes silicon oxide.

Example 6. The method of one of examples 1 to 5, where the refractory metal is tungsten, molybdenum, niobium, tantalum, or ruthenium.

Example 7. The method of one of examples 1 to 6, where the bulk material includes polycrystalline silicon or single crystalline silicon.

Example 8. The method of one of examples 1 to 7, where the refractory metal of the surface layer includes pure metal, metal carbide, metal nitride, or metal silicide.

Example 9. A method of etching a substrate includes loading the substrate into a plasma etch chamber, the substrate including a patterned hard mask layer and an underlying layer, the plasma etch chamber including a focus ring, the focus ring including a bulk material and a surface layer, the surface layer including a refractory metal; performing a surface pretreatment for the focus ring, the surface pretreatment including exposing the focus ring to a first plasma in the plasma etch chamber to form a coating over the surface layer; and performing a plasma etch process to etch the underlying layer, the plasma etch process including exposing the substrate to a second plasma in the plasma etch chamber, where the coating protects the focus ring from being etched by the second plasma.

Example 10. The method of example 9, further including repeating the plasma etch process to process a plurality of substrates without performing a chamber open service to replace the focus ring, a total time duration of repeating the plasma etch process is between 20 h and 1000 h.

Example 11. The method of one of examples 9 or 10, further including, after repeating the plasma etch process, evaluating a degree of wear damage of the focus ring.

Example 12. The method of one of examples 9 to 11, further including regenerating the coating in response to determining that the wear damage is greater than a threshold value for maintenance.

Example 13. The method of one of examples 9 to 12, where the first plasma includes carbon, and where the coating includes a carbide of the refractory metal.

Example 14. The method of one of examples 9 to 13, where the second plasma includes fluorine.

Example 15. The method of one of examples 9 to 14, where the first plasma and the second plasma are generated from a same process gas.

Example 16. The method of one of examples 9 to 15, where the surface pretreatment and the plasma etch process are overlapped in time.

Example 17. The method of one of examples 9 to 16, where the refractory metal is tungsten, molybdenum, niobium, tantalum, or ruthenium.

Example 18. The method of one of examples 9 to 17, where the bulk material accounts for between 90% and 99% by mass of the focus ring.

Example 19. A method of etching a substrate includes repeatedly performing a plasma etch process for a plurality of substrates in a plasma etch chamber including a focus ring, the focus ring including a bulk material and a surface layer, the surface layer including a refractory metal, the focus ring having a thickness at an outer edge greater than a thickness at an inner edge, each of the plurality of the substrates including a patterned hard mask layer and an underlying layer, the plasma etch process including loading one of the plurality of substrate into the plasma etch chamber, and exposing the substrate to a plasma generated from a process gas including fluorine and carbon in the plasma etch chamber, the plasma etching the underlying layer, where a coating including a carbide of the refractory metal is formed over the surface layer of the focus ring; and evaluating a wear damage of the focus ring, the evaluating including determining a change in a thickness of the focus ring at the outer edge or the inner edge.

Example 20. The method of example 19, further including regenerating the focus ring, the regenerating including depositing the refractory metal to recover the surface layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of etching a substrate, the method comprising:
    loading the substrate into a plasma etch chamber, the plasma etch chamber comprising a focus ring surrounding the substrate, the focus ring comprising a bulk material and a surface layer, the surface layer comprising a refractory metal;
    flowing a process gas comprising fluorine and carbon into the plasma etch chamber;
    coating a carbide layer over the surface layer of the focus ring, the coating comprising exposing the focus ring to a plasma generated from the process gas in the plasma etch chamber, the carbide layer comprising a carbide of the refractory metal; and
    etching the substrate, the etching comprising exposing the substrate to the plasma.

2. The method of claim 1, wherein the substrate comprises a patterned hard mask layer and an underlying layer, and wherein the etching comprises etching the underlying layer.

3. The method of claim 2, further comprising performing cycles of plasma etch process for a plurality of substrates without chamber open service to replace the focus ring, a total time duration of the cycles of plasma etch process is between 20 h and 1000 h.

4. The method of claim 2, wherein the patterned hard mask layer comprises amorphous carbon layer (ACL).

5. The method of claim 2, wherein the underlying layer comprises silicon oxide.

6. The method of claim 1, wherein the refractory metal is tungsten, molybdenum, niobium, tantalum, or ruthenium.

7. The method of claim 1, wherein the bulk material comprises polycrystalline silicon or single crystalline silicon.

8. The method of claim 1, wherein the refractory metal of the surface layer comprises pure metal, metal carbide, metal nitride, or metal silicide.

9. A method of etching a substrate, the method comprising:
    loading the substrate into a plasma etch chamber, the substrate comprising a patterned hard mask layer and an underlying layer, the plasma etch chamber comprising a focus ring, the focus ring comprising a bulk material and a surface layer, the surface layer comprising a refractory metal;
    performing a surface pretreatment for the focus ring, the surface pretreatment comprising exposing the focus ring to a first plasma in the plasma etch chamber to form a coating over the surface layer; and
    performing a plasma etch process to etch the underlying layer, the plasma etch process comprising exposing the substrate to a second plasma in the plasma etch chamber, wherein the coating protects the focus ring from being etched by the second plasma.

10. The method of claim 9, further comprising repeating the plasma etch process to process a plurality of substrates without performing a chamber open service to replace the focus ring, a total time duration of repeating the plasma etch process is between 20 h and 1000 h.

11. The method of claim 10, further comprising, after repeating the plasma etch process, evaluating a degree of wear damage of the focus ring.

12. The method of claim 11, further comprising regenerating the coating in response to determining that the wear damage is greater than a threshold value for maintenance.

13. The method of claim 9, wherein the first plasma comprises carbon, and wherein the coating comprises a carbide of the refractory metal.

14. The method of claim 9, wherein the second plasma comprises fluorine.

15. The method of claim 9, wherein the first plasma and the second plasma are generated from a same process gas.

16. The method of claim 9, wherein the surface pretreatment and the plasma etch process are overlapped in time.

17. The method of claim 9, wherein the refractory metal is tungsten, molybdenum, niobium, tantalum, or ruthenium.

18. The method of claim 9, wherein the bulk material accounts for between 90% and 99% by mass of the focus ring.

19. A method of etching a substrate, the method comprising:
repeatedly performing a plasma etch process for a plurality of substrates in a plasma etch chamber comprising a focus ring, the focus ring comprising a bulk material and a surface layer, the surface layer comprising a refractory metal, the focus ring having a thickness at an outer edge greater than a thickness at an inner edge, each of the plurality of the substrates comprising a patterned hard mask layer and an underlying layer, the plasma etch process comprising
loading one of the plurality of substrate into the plasma etch chamber, and
exposing the substrate to a plasma generated from a process gas comprising fluorine and carbon in the plasma etch chamber, the plasma etching the underlying layer, wherein a coating comprising a carbide of the refractory metal is formed over the surface layer of the focus ring; and
evaluating a wear damage of the focus ring, the evaluating comprising determining a change in a thickness of the focus ring at the outer edge or the inner edge.

20. The method of claim 19, further comprising regenerating the focus ring, the regenerating comprising depositing the refractory metal to recover the surface layer.

* * * * *